United States Patent [19]

Wang et al.

[11] Patent Number: 5,878,098
[45] Date of Patent: Mar. 2, 1999

[54] METHOD AND APPARATUS FOR RATE DETERMINATION IN A COMMUNICATION SYSTEM

[75] Inventors: Michael M. Wang, Champaign; Fuyun Ling, Hoffman Estates; Terry M. Schaffner, Palatine, all of Ill.

[73] Assignee: Motorola, Inc., Schaumburg, Ill.

[21] Appl. No.: 672,155

[22] Filed: Jun. 27, 1996

[51] Int. Cl.$^6$ .................................................. H04L 27/00
[52] U.S. Cl. ........................ 375/377; 375/265; 375/340; 371/43.8
[58] Field of Search .................................. 375/225, 265, 375/316, 340, 341, 377, 262; 370/465; 371/43.8, 43.7

[56] References Cited

U.S. PATENT DOCUMENTS

| | | | |
|---|---|---|---|
| 5,007,047 | 4/1991 | Sridhar et al. | 375/222 |
| 5,414,738 | 5/1995 | Bienz | 375/341 |
| 5,432,803 | 7/1995 | Liu et al. | 375/340 |
| 5,486,956 | 1/1996 | Urata | 375/341 |
| 5,493,586 | 2/1996 | Brownlie et al. | 375/265 |
| 5,541,955 | 7/1996 | Jacobsmeyer | 375/265 |
| 5,588,001 | 12/1996 | Riggle | 375/341 |

OTHER PUBLICATIONS

"Introduction to Spread–Spectrum Communications", Roger L. Peterson, Rodger E. Ziemer, and David E. Borth, Prentice Hall, Englewood Cliffs, NJ, 1995, pp. 412–427.

"An Alternative to Metric Rescaling in Viterbi Decoders", Andries P. Hekstra, IEEE Transactions on Communications, vol. 97, No. 11, Nov. 1989, pp. 1220–1222.

*Primary Examiner*—Tesfaldet Bocure
*Assistant Examiner*—Bryan Webster
*Attorney, Agent, or Firm*—Richard A. Sonnentag

[57] ABSTRACT

A method of determining a rate associated with a received signal including the steps of detecting the received signal (40); decoding the received signal at a first rate, determining a first path metric associated with the first rate, decoding the received signal at a second rate, and determining a second path metric associated with the second rate (44); calculating a plurality of discriminant functions based on the first and second path metrics (46); comparing at least one of the plurality of discriminant functions to a first predetermined value (48); and selecting one of the first and second rates as a determined rate based on the comparison.

16 Claims, 7 Drawing Sheets

METHOD AND APPARATUS FOR RATE DETERMINATION IN A COMMUNICATION SYSTEM

FIELD OF THE INVENTION

The present invention relates generally to communications, and more particularly to a method and apparatus for rate determination in a communication system.

BACKGROUND OF THE INVENTION

In certain communication systems, such as in a code division multiple access (CDMA) cellular system as defined by interim specification (IS) IS-95, a receiver in the communication system determines an estimated encoding rate for each received frame. In such systems, the rate determination accuracy affects speech quality since any rate determination error typically causes annoying artifacts in the decoded speech signal. In addition, since rate determination is performed on a real-time basis, it is important that the rate determination process is performed in an efficient and cost effective manner.

Accordingly, there exists a need for an improved apparatus and method for performing rate determination in a communication system.

SUMMARY OF THE INVENTION

In order to address this need as well as others, the present invention provides a method of determining a rate associated with a received signal. The method includes the steps of detecting the received signal, decoding the received signal at a first rate, determining a first path metric associated with the first rate, decoding the received signal at a second rate, determining a second path metric associated with the second rate, calculating a plurality of discriminant functions based on the first and second path metrics, comparing at least one of the plurality of discriminant functions to a first predetermined value, and selecting one of the first and second rates as a determined rate based on the comparison.

In accordance with another aspect of the present invention a method of decoding a received signal and determining a total metric in a receiver of a communication system is provided. The method includes the step of decoding the received signal by forming a decoding trellis and traversing a fixed length decoding path from a starting state to an ending state. While forming the decoding trellis and traversing the decoding path a counter is incremented when a state metric of a selected state crosses above a first threshold and the counter is decremented when the state metric of the selected state crosses below a second threshold. After traversing the decoding path the total metric is determined based on a value stored in the counter, based on the difference between the initial state metric value of the originating state and the final state metric value of the ending state, and based on the length of the decoding path.

The invention itself, together with its attendant advantages, may best be understood by reference to the following detailed description, taken in conjunction with the accompanying drawings.

DETAILED DESCRIPTION OF THE PREFERRED EMBODIMENT(S)

Figure 1:
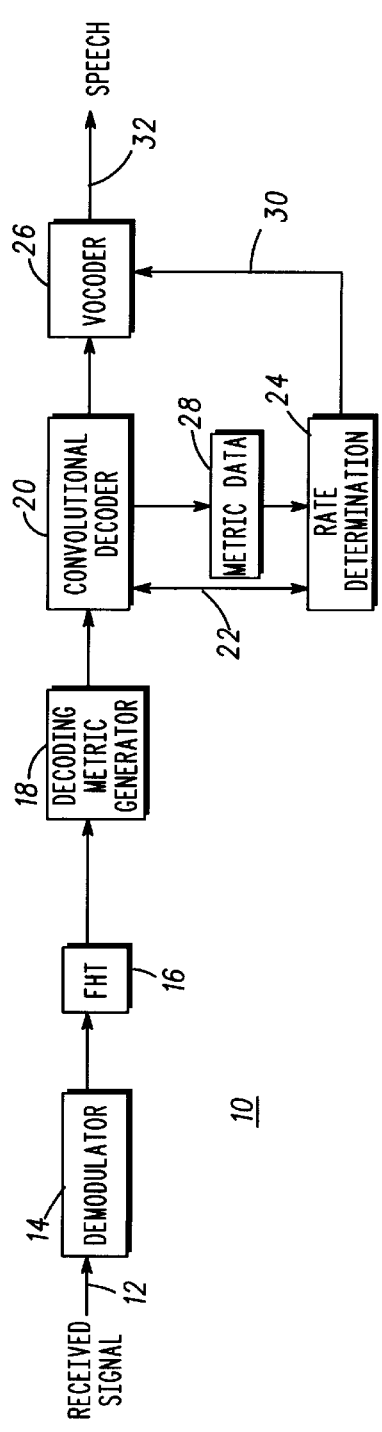
FIG. 1 is a block diagram of a receiver in a CDMA communication system that is suitable for use with an embodiment of the present invention.

Referring to FIG. 1, a block diagram of a receiver 10 of a communication system is illustrated. The receiver 10 includes a demodulator 14, a fast hadamard transform (FHT) module 16, a decoding and metric generator 18, a convolutional decoder 20, a rate determination module 24, and a vocoder 26. The convolutional decoder 20 is coupled to the rate determination module 24 via an interface 22. The receiver 10 may be a base station receiver such as a receiver in a Motorola SC9600™ base station or may be a receiver in a mobile unit, such as in a conventional CDMA cellular phone. Metric data 28, such as a decoding path metric, cyclic redundancy check, or quality bit data, is output by the decoder 20 and received by the rate determination module 24. The path metric, also referred to as a total metric, will be described in more detail below in reference to FIGS. 3–5.

During operation, a received signal 12 is detected and demodulated by demodulator 14, transformed by FHT 16, and decoded by decoders 18 and 20. Metric data 28 determined during the decoding process is passed to rate determination module 24. Rate determination module 24 determines an estimated encoding rate 30 which is fed to vocoder 26. Vocoder 26 then outputs speech data 32 based on input from the decoder 20 and the determined encoding rate 30.

Figure 2:
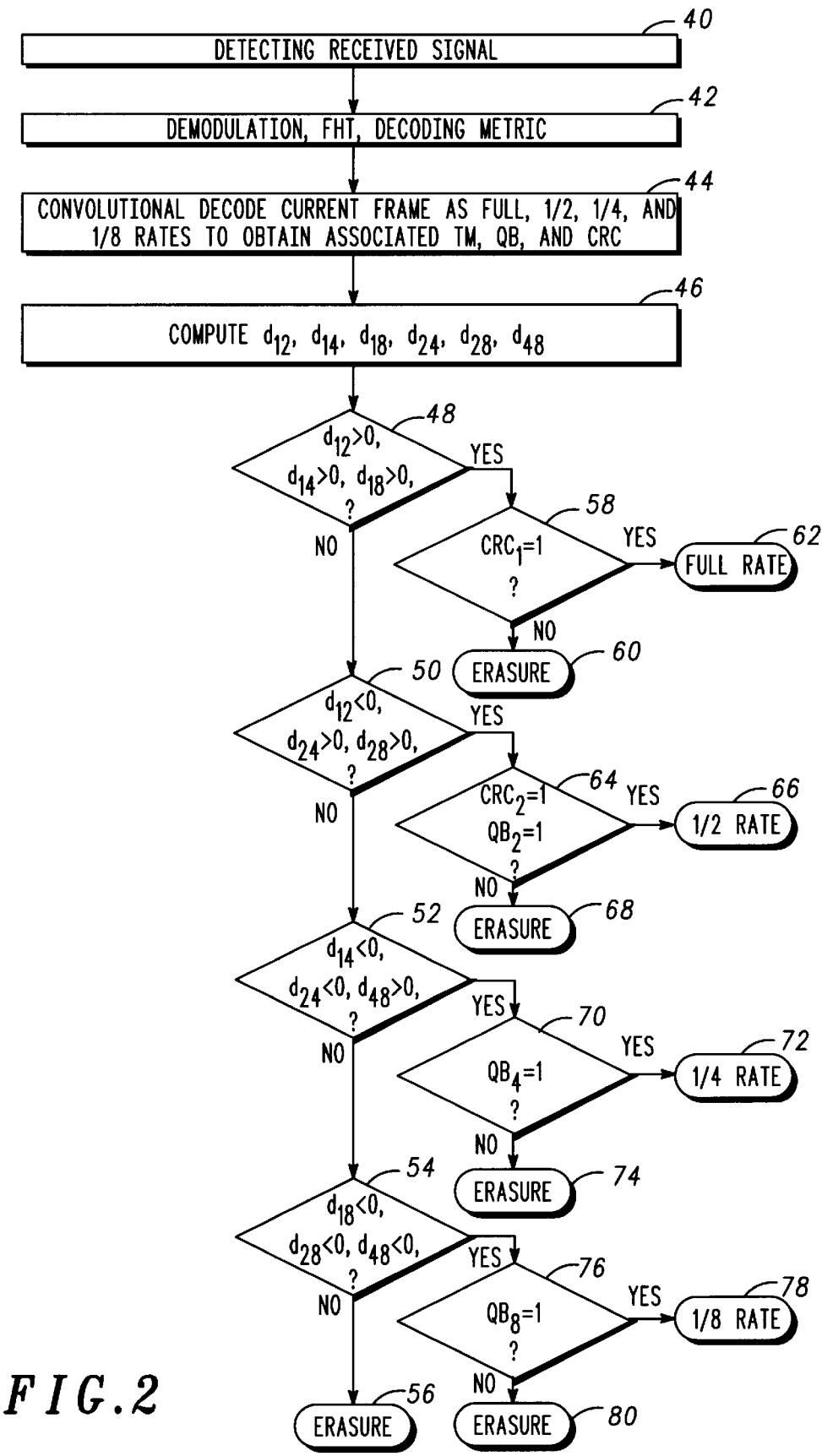
FIG. 2 is a flow chart of an embodiment of a method of performing rate determination in the receiver of FIG. 1.

Referring to FIG. 2, a method of performing rate determination is illustrated. First, the received signal 12 is detected, at step 40. The received signal 12 is then demodulated by demodulator 14, transformed by FHT 16, and decoded by decoders 18 and 20, at step 42. At step 44, an input frame of a signal derived from received signal 12 is convolutionally decoded at a plurality of encoding rates to determine a plurality of path metrics. For example, in a CDMA IS95 implementation, the signal is decoded at a first rate, e.g. full rate, a second rate, e.g. half rate (½), a third rate, e.g. quarter rate (¼), and a fourth rate, e.g. eighth rate (⅛), to produce a first set of metrics, a second set of metrics, a third set of metrics, and a fourth set of metrics. Each of the four sets of metrics include a path metric, such as a total metric (TM), an error indicator, such as a cyclic redundancy check (CRC), and a quality indicator, such as a quality bit (QB).

Next, at step 46, a plurality of discriminant functions are calculated based on the decoding path metrics for the plurality of sets of metrics. In a particular example, disriminant function (D12) is based on the total metric for the first set of metrics and the total metric for the second set of metrics. Note that for discriminant function D12, the "1" indicates full rate and the "2" indicates half rate. Similarly, discriminant function D14 is based on the total metric from the first and third set, i.e. full rate and quarter rate, and D18 is based on the total metric from the first and fourth set, i.e. full rate and eighth rate. Likewise, D24 is based on the second and third set, D28 is based on the second and fourth set, and D48 is based on the third and fourth set. A particular illustrative example of a set of discriminant function calculations is:

D12=0.6594*TM1 (total metric from the first set)–0.7518* TM2 (total metric from the second set)–39

D14=0.6060*TM1–0.7954*TM4–40

D18=0.3714*TM1–0.9285*TM8–25

D24=0.6603*TM2–0.7510*TM4–20

D28=0.5300*TM2–0.8480*TM8–25.

D48=0.6247*TM4–0.7809*TM8–14.

After the discriminant functions have been calculated, a select group of the discriminant functions are each compared to a predetermined threshold, at 48. In the particular example of FIG. 2, the predetermined thresholds are zero, but it is contemplated that other thresholds may be used. If the comparison is satisfied, then the cyclic redundancy check (CRC) of set 1 (CRC1) is checked. If CRC1=1 then a determination of full rate is made, at step 62, for the particular frame and processing is completed. Otherwise, an error condition is detected and marked as a frame erasure, at step 60.

If the result of the comparison at decision step 48 is negative, a second group of discriminant functions is compared to a second predetermined set of thresholds at decision step 50. In the particular example of FIG. 2 the predetermined thresholds are zero, but it is contemplated that other thresholds may be used. If each of the discriminant functions satisfies the comparison, then the error detection and quality indicator are checked at decision step 64. If CRC2=1 and QB2 (quality bit for the second set)=1, then a half rate frame is determined, at step 66; otherwise, a frame erasure is marked due to a frame error at step 68.

If the result of the comparison at decision step 50 is negative, then processing continues at decision step 52. At decision step 52, a third set of discriminant functions are compared to a third set of thresholds. If all of the comparisons are positive, the error detection (if available) and a quality indicator for the third set, QB4, is compared to a quality threshold, at decision step 70. If the result is successful, at decision step 70, then a quarter rate determination is made at step 72. If the quality comparison is not successful, at 70, then an erasure is marked and an error is detected, at step 74.

Continuing at decision step 54, a fourth set of discriminant functions are compared to a fourth set of thresholds. If the comparison is successful and an error detection (if available) and quality condition are satisfied (i.e., CRC8=1 and QB8=1), at step 76, then an eighth rate frame is detected, at step 78. Otherwise, an erasure is marked and an error is detected, at either 56 or 80.

Compared to the prior art rate determination methods, such as the one based on the re-encoded symbol error rate (SER), described in U.S. patent application No. 08/624,233 "Method and Apparatus for Determining Coding Rate in a Wireless Communication System", attorney docket number CE02999R by Michael Wang et al., filed Mar. 29, 1996, which is incorporated by reference herein, this method of performing rate determination has the advantage of lower ratemisdetermination rate since the total metric is a better measure of the likelihood of the coding rate than SER.

To decode a received convolutionally coded signal, or simply a received signal, using a maximum-likelihood decoder employing a Viterbi-type algorithm, a receiver first computes a decoding metric for each coded data bit, called bit metric, of the received signal. The optimal bit metric of a transmitted coded bit in such a decoder is the log-likelihood value of the received signal given the coded bit is transmitted. It is also called the soft-decision of the coded bit.

Let us consider the decoding process of a rate $1/r$ convolutional code with a constraint length of K. The decoding process using a Viterbi decoder is a recursive process, which is usually described by a trellis diagram. Each recursion of the decoding process is called a decoder timing step. The decoder has a RAM array that stores state-metrics. The number of state metrics, i.e., the size of the RAM, is equal to $2(K-1)$. The state metric RAM is usually initialized to the same value, e.g., 0. However, if the transmitted signals are organized in blocks, such as in typical cellular communications, the originating and ending states for each block are predefined. The initial value of the state metric RAM corresponding to the known originating state of the code is initiated to a value much larger (or much smaller depending on the decoder implementation) than the initial values of other states.

In a trellis diagram representing the decoding process, at each decoder timing step, two branches extend from each of the states and end at two different states. Each branch corresponds to one information bit and r coded bits, which are determined by the information bit together with the state from which the branch starts. A branch metric, which is the sum of the bit metrics of the coded bits associated with a branch, is computed for each of the branches.

For a given decoder timing step i, branches that start from state j end up at states m and n of a next decoder timing step i+1. Two accumulated metrics are computed by adding the two branch metrics to the metric of state j. Because there are a total of $2 \times 2^{(K-1)}$ branches generated at step i, there will be two branches end up at each state of step i+1. The two accumulated metrics associated with the two branches ending at the same state are compared to each other and the branch with the smaller accumulated metric is deleted and the larger one becomes the state metric at decoder timing step i+1 of the said state. At the end of each decoder timing step, there are only $2^{(K-1)}$ surviving branches, each of which ends at a different state. The connected branches leading to a state form the surviving path of the state.

This process continues until the end of the block is reached, i.e., all the coded bits are exhausted. After the final step, the ending state is determined. For the block terminated convolutional code described above, the known terminating state of the code is the ending state. Otherwise, the state with the largest state metric is the ending state. The decoder then starts a process called tracing back.

The tracing back process starts from the ending state of the trellis. The tracing back process determines the surviving path of the ending state and the states along the surviving path. The information bits associated with the branches of the surviving path are the decision bits. The coded bits associated with these branches are called re-encoded bits.

It can be seen from the description given above that the state metric of the ending state is equal to the sum of the branch metrics of the branches that form the surviving path, i.e., the log-likelihood of all the decision bits. In other words, it is the sum of the log-likelihood values of the re-encoded bits. We call the state metric of the ending state the total metric of the surviving path, or simply, total metric.

Since the total metric is a measure of the likelihood of the decision bits, it can be used for determining which of the multirate decoding results is likely to be valid in the rate determination algorithm.

Figure 3:
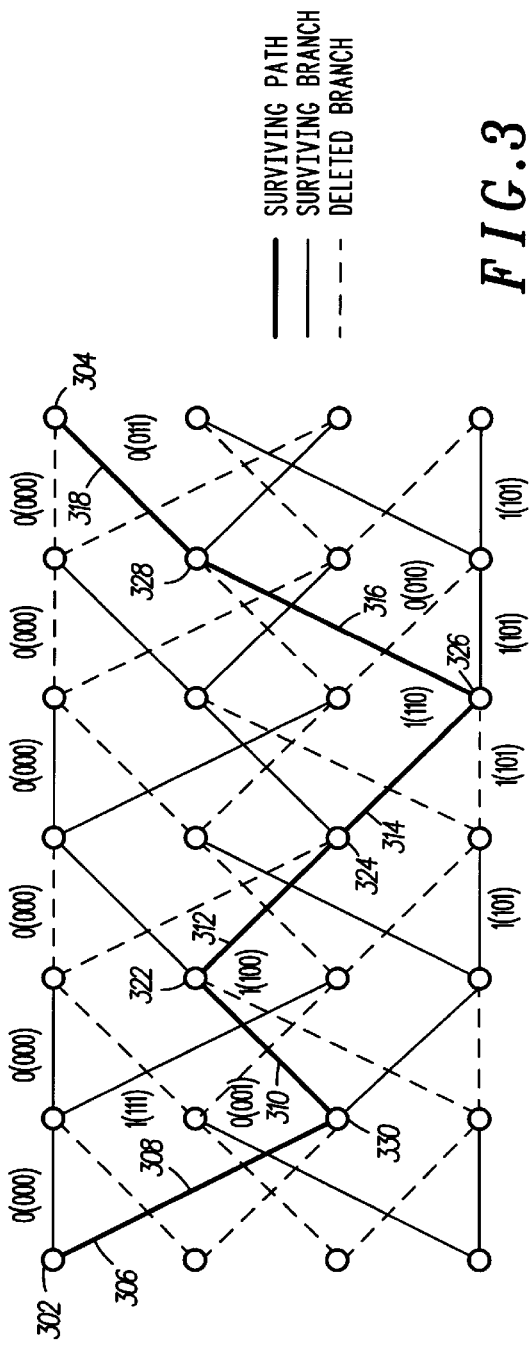
FIG. 3 is a diagram that illustrates a method of decoding and determining metrics that may be used in rate determination.

Referring to FIG. 3, a Trellis diagram of a Viterbi Decoder is illustrated. The Trellis Diagram illustrates a method of decoding a received signal in a receiver of a communication system. The diagram includes a plurality of potential decoding paths. Each of the plurality of potential decoding paths includes a plurality of decoding states and a plurality of branches that connect each decoding states in the decoding path. The decoding path that is used is determined based on the well known Viterbi algorithm and is referred to as the surviving path, labeled 306. Decoding path 306 includes an initial state 302, an ending state 304, and a plurality of intermediate states 330, 322, 324, 326, and 328. The decoding path 306 includes a plurality of branches 308, 310, 312, 314, 316, and 318. In the example illustrated in FIG. 3, each of the states in the decoding path 306 may have one of four possible values, corresponding to the four horizontal rows of states in the diagram. Thus, the initial state 302 has the same value as the ending state 304. Likewise, state 330 has the same value as state 324. The decoding path 306 has a plurality of decoding bits and re-encoded bits. Each of the branches in the decoding path 306 is associated with a decoding bit and re-encoded bits. For example, branch 308 is associated with decoding bit value 1 and re-encoded bits 111. The decoding path 306 as a whole has decoding bits and re-encoded bits based on the decoding bit and re-encoded bits for each branch in the path 306. Decoding path 306 therefore has decoding bits of 101100 and re-encoded bits of 111001100110010011.

In the description given above, it can be seen that state metrics grow linearly with the number of decoder timing steps. If the convolutional decoder is run for a long time without termination, the state metrics can become quite large and eventually overflow a RAM that stores the state metrics. When the code is block terminated, the required word-lengths of the state metrics is determined by the block size, which can be quite large as well. The required word-length can be reduced by using a modulo representation of the state metrics. See A. P. Hekstra, "An Alternative to Rescaling in Viterbi Decoders," IEEE Trans. on Comm., Vol.. 37, No. 11, pp. 1220–1222, Nov. 1989.

Assuming that the RAM is L bits wide, when an accumulated metric is computed, we may simply keep the lower L bits and discard the overflow bit if it occurs. If the state metric is viewed as a two's complement number, the range of the state metrics is from $-2^{L-1}$ to $2^{L-1}-1$. To compare two numbers A and B, we subtract B from A and discard the overflow bit if it occurs. The comparison is done by examining the most significant bit (MSB) of the difference. If the MSB is equal to 0, we have A>B. Otherwise, if the MSB is equal to 1, we have B>A.

With the modulo representation, the total metric cannot be generated by simply computing the difference between the state metrics of the ending and originating states. Additional steps are needed to obtain the total metric from the modulo representations of the state metrics of the ending and originating states. Namely, we count how many modulo operations in a given state have occurred during the demodulation process. When L is properly chosen, the difference between different state metrics cannot be greater than half of the modulo range. Thus, we are able to count the number of modulo operations for one particular state. For the IS-95 coded data structure, the trellis starts from the zero state and ends at the zero state and it is most convenient to monitor the zero state. Specifically, a counter is initially set to zero, if a positive modulo operation occurs from one decoder timing step to the next in the zero state, i.e., the state metric of zero state exceeds the top of the range (crosses above a first threshold) of its modulo representation, the counter is incremented by one. Otherwise, if a negative modulo operation occurs, i e., the state metric of zero state becomes less than the bottom of the range (crosses below a second threshold), the counter decrements by one. For the implementation described above using L bit RAMs, these two conditions are equivalent to that of a two MSB change from 11 to 00 and from 00 to 11, respectively. For an IS-95 decoder, a 4 to 5 bit counter is preferred.

After the whole block is decoded, the total metric is set equal to the final modulo state metric of the ending state plus the content of the counter multiplied by the range, i.e., 2L in the above example minus the initial state metric of the originating state.

Figure 4:
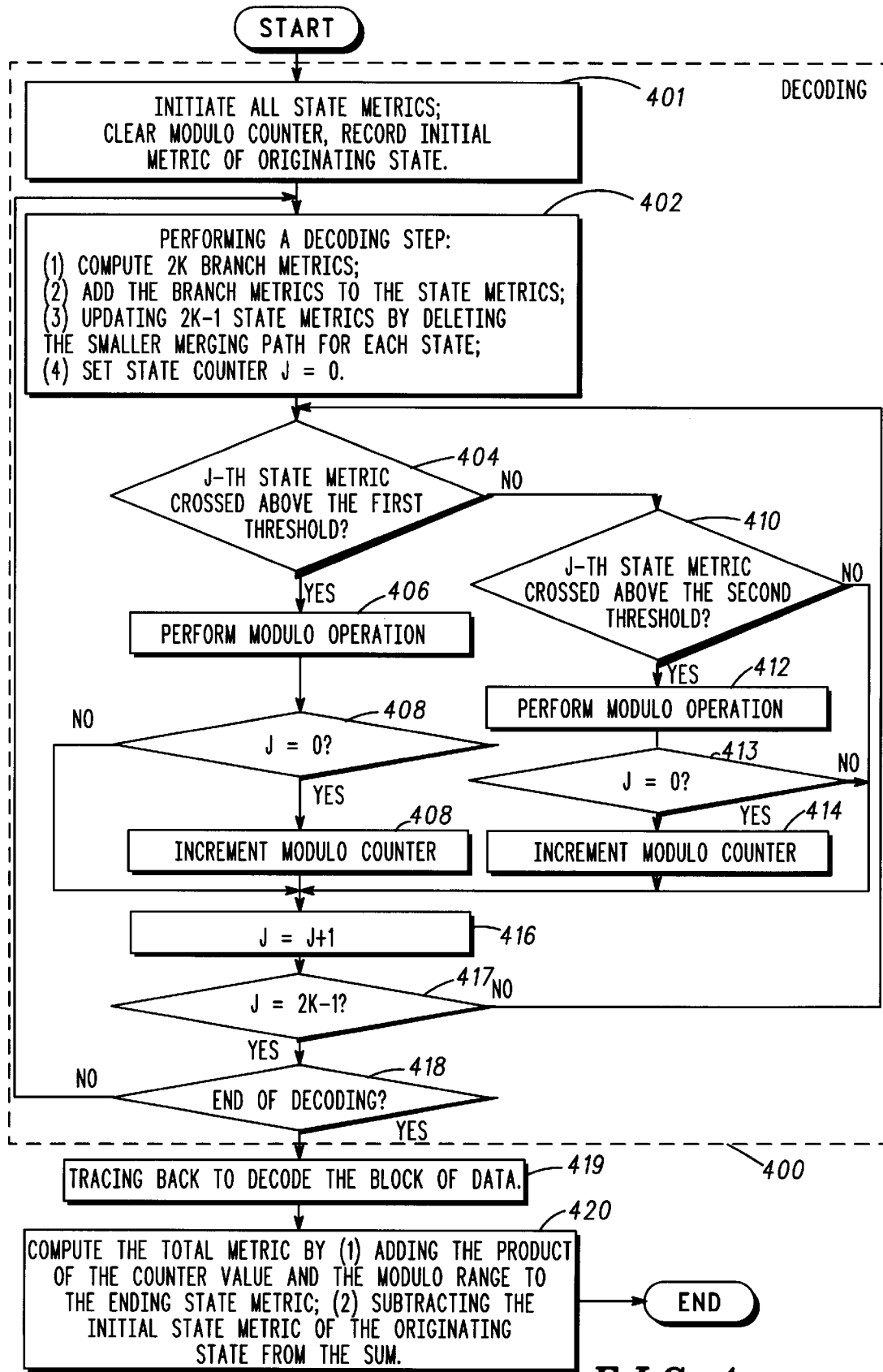
FIG. 4 is a flow chart of an embodiment of a method of determining a path metric of a decoded signal.

Referring to FIG. 4, a method of determining a total metric for a decoded signal is illustrated. At 400, a decoding path, such as decoding path 306, is traversed from a starting state to an ending state, while forming the decoding trellis. To compute the total metric of decoding path 306, one of these states is selected as a selected state. In the figure, the selected state is state 0. The starting state is selected, at 401, and state metrics of all states in the trellis are determined at step 402 at each decoder timing step.

The state metric of each decoding state is then compared to a first threshold, at decision step 404. If the state metric has crossed above a first threshold, then a modulo operation is performed, at 406, and if the state is the selected state, a counter is incremented, at 408. Otherwise, the state metric is compared to a second threshold, at decision step 410. If the state metric has crossed below a second threshold, than a modulo operation is performed, at 412, and if the state is the selected state, the counter is decremented, at 414. Next, at 416, the next state in this decoder timing step is selected. If this state is not the last state, as determined by step 417, steps 404–416 are repeated. Otherwise, the next decoder timing step is performed. If the new decoder timing step is not the final decoder timing step, as determined by decision step 418, then the above steps 402–416 are repeated. After reaching the final decoder timing step, a total metric is determined based on the counter value, based on the difference between the initial state metric value of the originating state and the final state metric value of the ending state, and based on the length of the decoding path, at 420. In a particular embodiment, the total metric is determined by multiplying the counter value by a difference value where the difference value is the difference between the first and second thresholds to produce an intermediate result that is then added to the state metric for the ending state. Then the state metric of the ending state is added to the intermediate result and the initial state metric of the originating state is subtracted from it to result in the total metric. It should be noted that for the addition and subtraction said above, the value of the state metric of the ending state and the value of the initial state metric of the originating state are treated as unsigned integers, while the value in the counter is treated as a two's complement value. Although a counter independent from the decoding path may be used, the counter may be implemented as additional data, such as an extended word, integrated within a memory storing data representative of at least one of the states in the decoding path.

In the procedure given above, we assumed that the originating state and the ending state are both the zero state. Even if the ending and/or originating states are not the same as the state selected to be monitored for the modulo operations, the total metric may be recovered. However, in this case more steps are needed. Namely, we need to determine the difference between state metrics of the ending state and the selected state and the difference between initial state metrics of the selected state and the originating state.

These two difference should be added to the total metric computed from the selected state to yield the total metric of the surviving path.

Figure 5A:
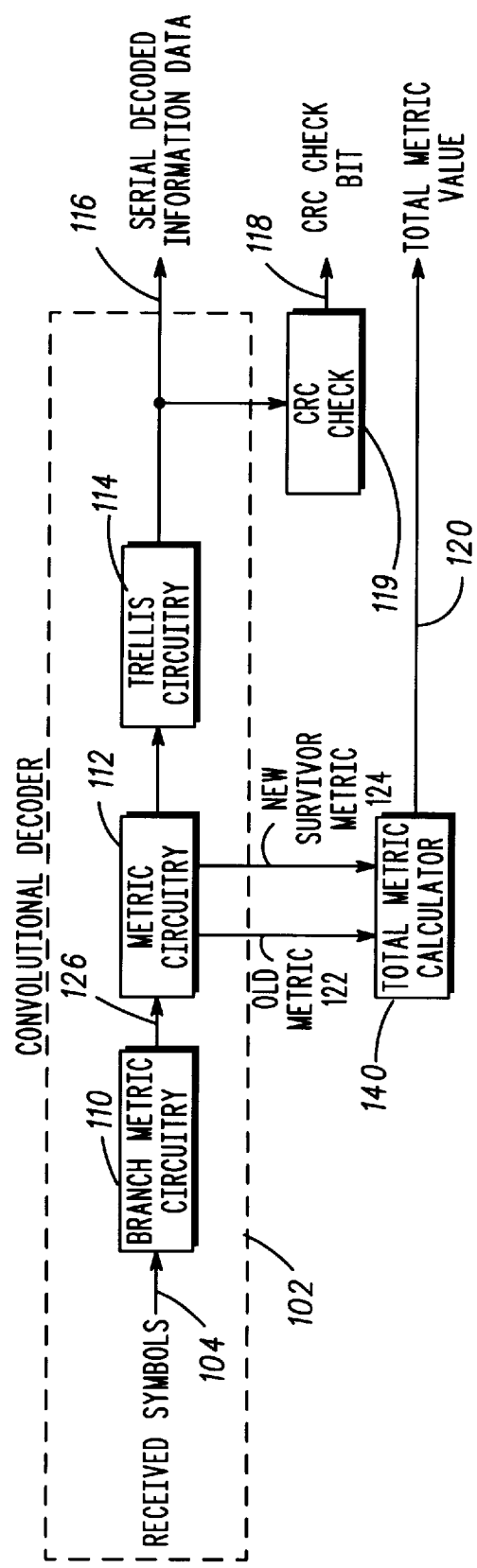
FIG. 5 is a block diagram of an embodiment of an apparatus for determining metrics for use in rate determination.
Figure 5B:
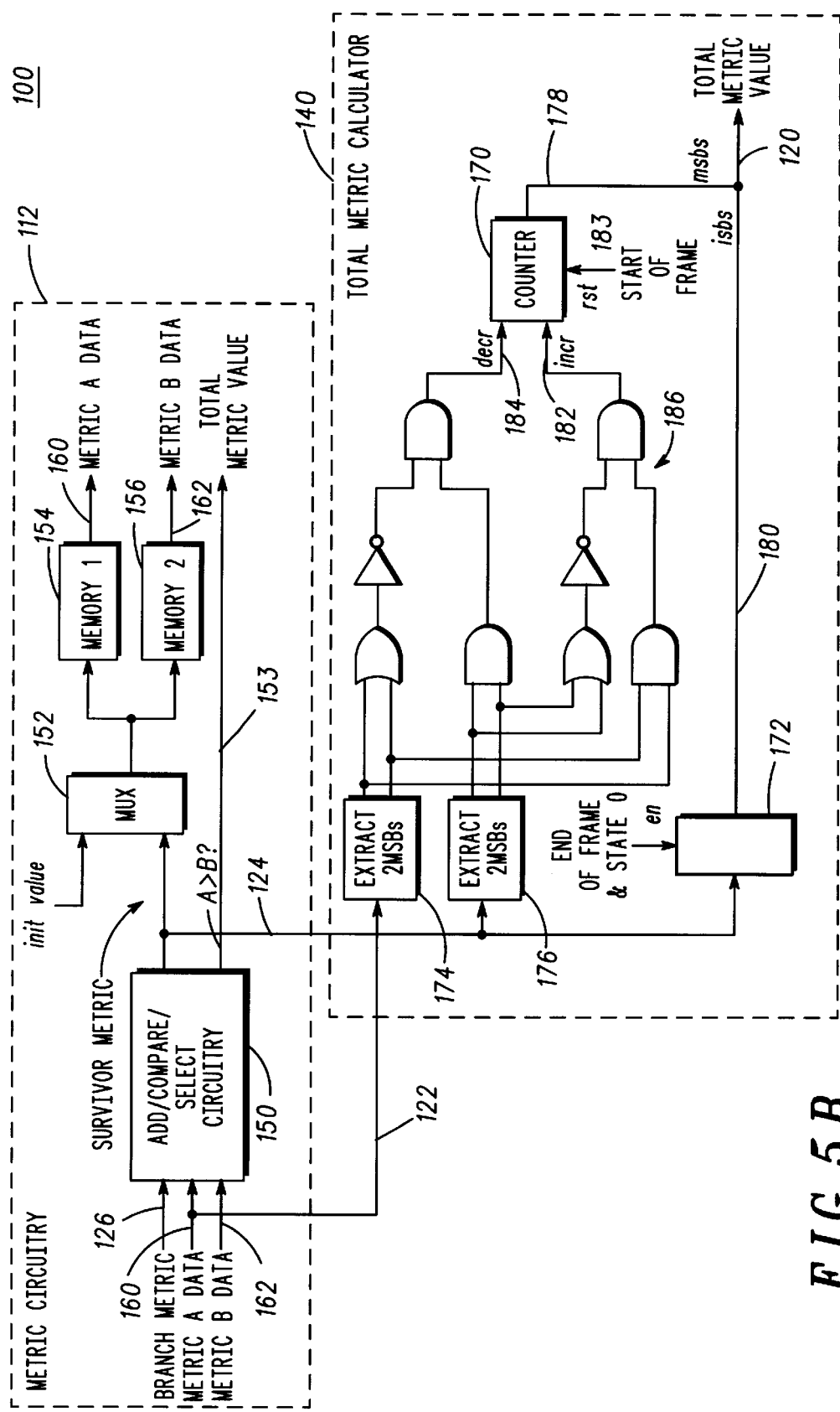

Referring to FIG. 5, a first embodiment of an apparatus for determining metric data, such as the total metric data used to determine discriminant functions, that may be used in the rate determination method of FIG. 2. is illustrated. The apparatus 100 includes a convolutional decoder 102, a total metric calculator 140, and a CRC check unit 119. The convolutional decoder 102 includes branch metric circuitry 110, metric circuitry 112, and trellis circuitry 114. The trellis circuitry 114 is coupled to the metric circuitry 112 which is coupled to the branch metric circuitry 110. The metric circuitry 112 is also coupled to the total metric calculator 140, and the trellis circuitry is coupled to the CRC check unit 119.

The branch metric circuitry 110 receives symbols 104 at its input and produces branch metrics 126 at its output. Metric circuitry 112 receives the branch metrics 126 and produces an old metric output 122 and a new survivor metric output 124. Trellis circuitry 114 in response to the metric circuitry 112, produces decoded information data 116. CRC check unit 119 receives the decoded information data 116 and produces a CRC check bit 118. Further details of convolutional decoders including an explanation of trellis circuitry is described in "Introduction to Spread-Spectrum Communications", by Peterson, Ziemer, and Borth, pages 413–427 (1995).

Metric circuitry 112 includes a processing unit 150 including addition, comparison, and selection circuitry, a multiplexor 152, a first memory 154, and a second memory 156. The first memory 154 stores and produces metric A data 160, and the second memory 156 stores and produces metric B data 162. The processing unit 150 receives branch metric data 126, metric A data 160 and metric B data 162, and produces survivor metric 124 and a survivor metric select output 153.

Total metric calculator 140 includes a first bit extraction unit 176, a second bit extraction unit 174, an end of frame register 172, digital logic 186 to monitor modulo operations and transitions, and a counter 170. The counter 170 has an increment input 182, a decrement input 184, a frame start input 183, and a counter output that generates counter output signal 178. Register 172 receives and stores new survivor metric 124 from metric circuitry 112 and produces an output metric 180 that is combined with counter output 178 to produce the total metric value 120. The first bit extraction unit 176 determines the two most significant bits of the new survivor metric 124 and the second bit extraction unit 174 determines the two most significant bits of the old metric 122. Based on a comparison of the bits from the first and second bit extraction units 176 and 174 performed by the digital logic 186, the counter 170 may be either incremented or decremented. In this manner, counter 170 accumulates a counter value that is based on modulo operations indicative of changes that occur to metric data during the decoding process.

FIG. 5, depicts a block diagram of a convolutional decoder and a total metric calculator circuit. As previously explained, the Total Metric Calculator 140 extends the range of the path metric data by counting the number of modulo operations which occur along the path between the starting decoder state and the ending decoder state. The full path metric information is then reconstructed by concatenating the counter with the path metric value of the ending state. At the start of a decoder frame, when the received symbols are demodulated and first presented to the convolutional decoder for decoding, Counter 170 is reset to zero. The Convolutional Decoder 102 initializes each path metric value to a known state then begins decoding the received symbols 104. For each decoder time step, the Total Metric Calculator 140 receives the current path metric data 122 for decoder state 0 and the surviving next path metric data 124 for decoder state 0. The bit extraction units 174, 176 extract the two most significant bits from each data value and feed these signals to logic 186 which determines whether the counter value holds at the current count, increments by one, or decrements by one. If the path metric changes from a positive value to a negative value, the counter 170 is decremented by one. If the path metric changes from a negative value to a positive value, the counter 170 is incremented by one. If, however, an underflow or overflow occurs with the change in sign of the path metric, the counter value remains unchanged. In order to differentiate between a change in sign of the path metric with no overflow or underflow and one with overflow or underflow, the two most significant bits must be monitored. When the two most significant bits of the path metric change from a '00 to a '11' the counter 170 is decremented by one, and when the two most significant bits change from a '11 to a '00' the counter 170 is incremented by one. At the end of a frame, when the decoder 102 is processing path metrics for the last time step, the path metric of the known ending state (state 0 in this case) is captured by latch 172. The final Total Metric Value 120 is constructed by concatenating the counter value 178 from counter 170 with the latched ending state path metric 180.

Figure 6A:
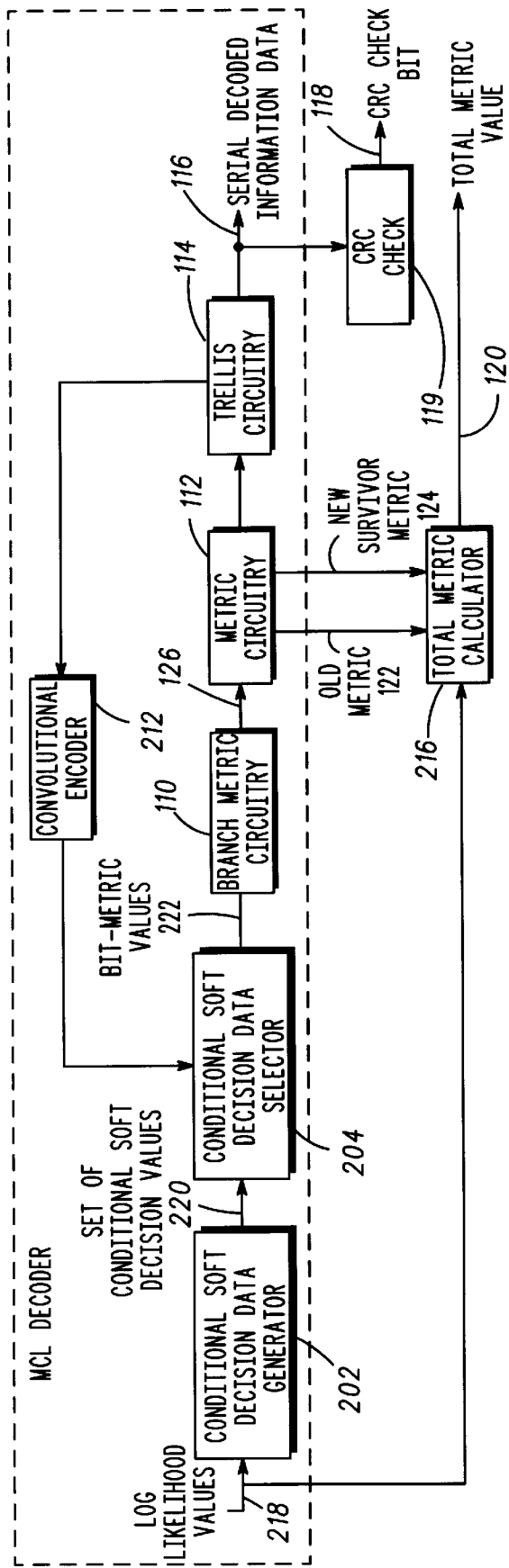
FIG. 6 is a block diagram of another embodiment of an apparatus for determining metrics for use in rate determination.
Figure 6B:
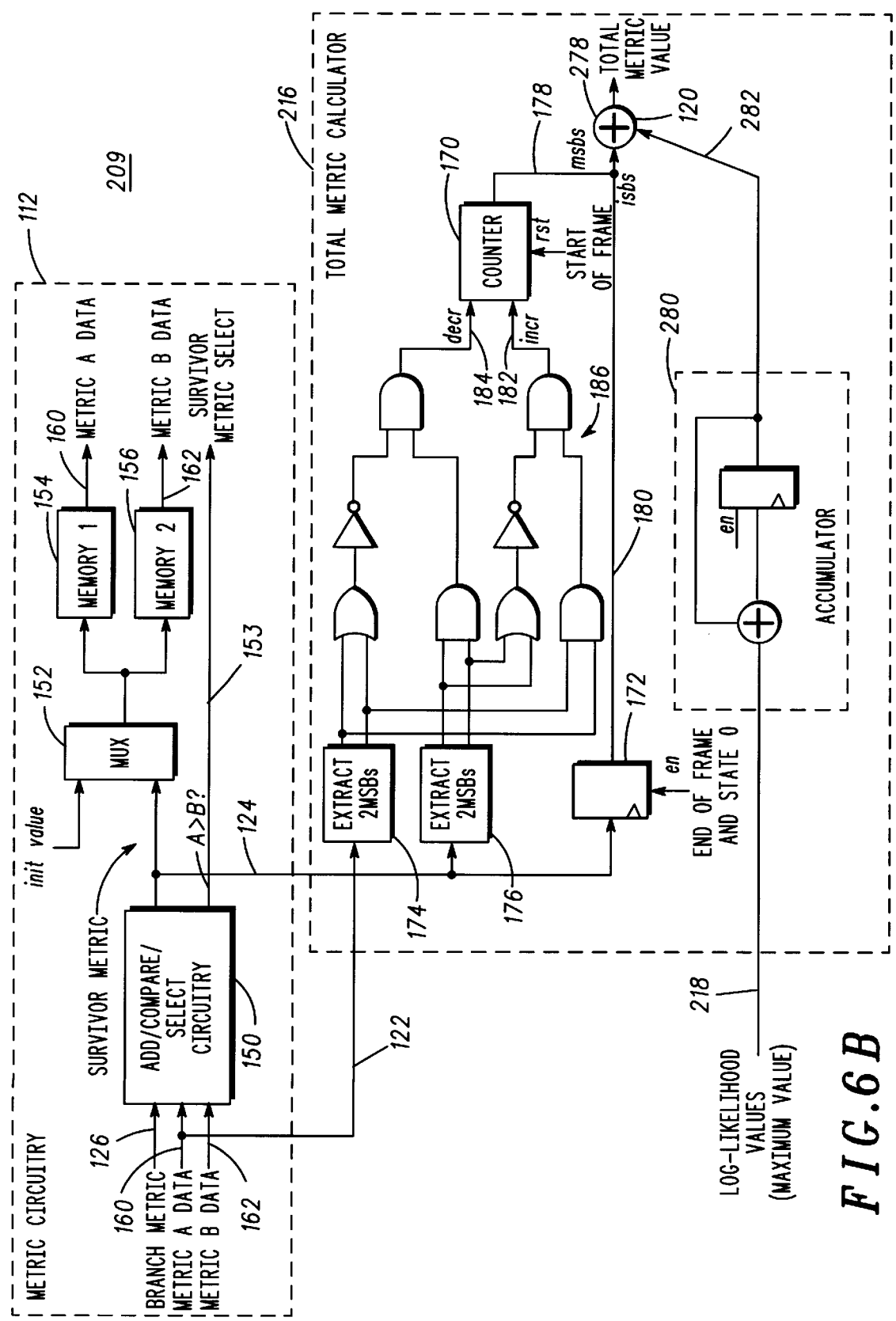

Referring to FIG. 6, where like elements are designated by like reference numbers, another embodiment of an apparatus for determining metric data that may be used in rate determination is illustrated. The apparatus 200 includes a soft decision data generator 202, a soft decision data selector 204, branch metric circuitry 110, metric circuitry 1 12, trellis circuitry 1 14, convolutional encoder 212, total metric calculator 216, and CRC check unit 119.

Total metric calculator 216 is similar to total metric calculator 140, but has been modified by adding summer 278 and accumulator 280.

FIG. 6, is a block diagram of the preferred embodiment of the Total Metric Calculator when used in conjunction with a Maximum Conditional Likelihood (MCL) Decoder. An example of an MCL decoder is provided in U.S. patent application Ser. No. 08/581,696 entitled "Method and Apparatus of Decoding a Received Signal", attorney docket number CE02924R by Schaffner et al., filed Dec. 29, 1995 which is incorporated by reference herein. The Total Metric Calculator for an MCL Decoder is slightly different than that of a conventional decoder due to differences in the characteristics of the MCL Decoder path metrics. One difference is that each state metric value is relative to a best, possibly invalid, path sequence. Therefore, this best path sequence value referred to as the maximum total path metric value 282, is computed and summed with the final MCL Decoder path metric value to obtain the total metric value. Accumulator 280 accumulates the largest log-likelihood values 218 for each symbol to obtain the maximum total path metric 282. The relative total metric value, which consists of the concatenation of the latched ending state path metric 180 and the counter value 178, is added to the maximum total path metric 282 by adder 278. This result becomes the total path metric value 120. The second characteristic eliminates the need of the incrementing function of counter 170.

In the preferred embodiment of an IS-95 receiver, the path metric 180 becomes the 12 least significant bits of the relative total metric value and the counter value 178 becomes the most significant four bits of the relative total metric value. Accumulator 280 accumulates 8-bit log-likelihood values 218 to create a 16-bit maximum total path metric value 282. Adder 278 sums the two 16-bit values to create a 16-bit total metric value 120.

It can be seen from the description given above that the difference between the state metric of the ending state and the initial value of the originating state is equal to the sum of the branch metrics of the branches that form the surviving path, i.e., the likelihood of all the decision bits. In other words, it is the sum of the log-likelihood values of the re-encoded bits. We call the state metric of the ending state the total metric of the surviving path, or simply, total metric. Since the total metric is a measure of the likelihood of the decision bits, it is used for determining which of the multirate decoding results is likely to be valid in the rate determination algorithm as described above.

The circuits for computing the total metric value as described above and illustrated in FIG. 5 and FIG. 6 have the advantage of providing the total metric value with a minor increase in circuitry while eliminating the need for increased memory capacity for storage of the decoder path metrics. One alternative to the preferred implementation would be to increase the resolution of all decoder path metrics so that no modulo operations may take place while decoding a block of data. The total metric in this case is then simply the difference between the ending decoder path metric and the initial path metric of the starting state. If the starting state path metric is chosen to be equal to zero, the total metric is then the ending decoder path metric.

A second alternative to the above described implementations would be one which rescales the decoder metrics. This involves subtracting the largest path metric value (or smallest path metric value, depending on the implementation) found in the previous decoder time step from each of the surviving path metric values computed in the current time step. This rescaling operation prevents the path metrics from increasing in value beyond the point of which the value can not be accurately represented given the fixed resolution of the path metric values. The total metric value in this case is then the ending decoder path metric minus the initial path metric of the starting state plus the sum of the rescale values subtracted from each of the decoder paths.

Further advantages and modifications of the above described apparatus and method will readily occur to those skilled in the art. The invention, in its broader aspects, is therefore not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. A method of determining a rate associated with a received signal, the method comprising the steps of:

detecting the received signal;

decoding the detected received signal at a first rate;

determining a first total metric associated with the first rate;

decoding the received detected signal at a second rate;

determining a second total metric associated with the second rate;

calculating a plurality of discriminant functions based on the first and second total metric;

comparing at least one of the plurality of discriminant functions to a first predetermined value;

selecting one of the first and second rates as a determined rate based on the comparison.

2. The method of claim 1, further comprising the step of comparing another of the plurality of discriminant functions to a second predetermined value.

3. The method of claim 1, further comprising the steps of:

decoding the received detected signal at a third rate;

determining a third total metric associated with the third rate; and calculating a plurality of discriminant functions based on the third total metric.

4. The method of claim 1, further comprising the step of checking an error indicator before selecting one of the first and second rates.

5. The method of claim 1, further comprising determining a quality metric.

6. The method of claim 5, further comprising the step of detecting a framing error based on the quality metric.

7. The method of claim 1, further comprising detecting a framing error based on a comparison to each of the plurality of determinant functions.

8. The method of claim 1, wherein the total metric comprises a soft correlation metric.

9. The method of claim 8, wherein the match score is based on input symbols, each of the input symbols represented by a plurality of data bits.

10. In a receiver of a communication system, a method of decoding a received signal and determining a total metric, the method comprising the steps of:

decoding the received signal by forming a decoding trellis, which consists of a plurality of decoding states, and traversing a decoding path having a fixed length, the decoding path having an initial state and an ending state;

while forming a decoding trellis and traversing the decoding path from the starting state to the ending state:

incrementing a counter when the state metric of a selected state crosses above a first threshold;

decrementing the counter when the state metric of the selected state crosses below a second threshold;

after traversing the decoding path:

determining the total metric based on a value stored in the counter, based on the difference between the initial state metric value of the originating state and the final state metric value of the ending state, and based on the length of the decoding path.

11. The method of claim 10, further comprising multiplying the counter value by a difference value, the difference value based on the difference between the first and second thresholds, to produce an intermediate result and adding a state metric of the ending state to the intermediate result and subtracting a state metric of the originating state from the intermediate result to produce total metric.

12. The method of claim 10, further comprising the step of dividing the total metric by the length of the decoding path.

13. The method of claim 10, further comprising performing a modulo operation prior to incrementing the counter.

14. The method of claim 10, wherein the beginning state is equal to the ending state.

15. The method of claim 10, wherein the beginning state is a zero state.

16. The method of claim 10, wherein at least one of the states in the decoding path has an extended word length and the at least one of the states serves as the counter.

* * * * *